US010839981B2

(12) United States Patent
Gundel

(10) Patent No.: US 10,839,981 B2
(45) Date of Patent: Nov. 17, 2020

(54) HIGH SPEED TRANSMISSION CABLE

(75) Inventor: Douglas B. Gundel, Cedar Park, TX (US)

(73) Assignee: 3M Innovative Properties Company, St. Paul, MN (US)

(*) Notice: Subject to any disclaimer, the term of this patent is extended or adjusted under 35 U.S.C. 154(b) by 749 days.

(21) Appl. No.: 13/985,074

(22) PCT Filed: Apr. 4, 2012

(86) PCT No.: PCT/US2012/032112
§ 371 (c)(1),
(2), (4) Date: Aug. 13, 2013

(87) PCT Pub. No.: WO2012/138717
PCT Pub. Date: Oct. 11, 2012

(65) Prior Publication Data

US 2014/0017493 A1 Jan. 16, 2014

Related U.S. Application Data

(60) Provisional application No. 61/472,716, filed on Apr. 7, 2011.

(51) Int. Cl.
*H01B 7/08* (2006.01)
*G02B 6/44* (2006.01)
(Continued)

(52) U.S. Cl.
CPC ............. *H01B 7/02* (2013.01); *H01B 7/0233* (2013.01); *H01B 11/1856* (2013.01); *H01B 11/203* (2013.01); *Y10T 428/2935* (2015.01)

(58) Field of Classification Search
CPC .................................. H01B 7/02; H01B 9/04
(Continued)

(56) References Cited

U.S. PATENT DOCUMENTS

| | | | |
|---|---|---|---|
| 463,107 | A | 11/1891 | Degenharat |
| 1,978,418 | A | 10/1934 | Dudley |

(Continued)

FOREIGN PATENT DOCUMENTS

| | | |
|---|---|---|
| AU | 273087 | 3/1965 |
| DE | 1804663 | 2/1970 |

(Continued)

OTHER PUBLICATIONS

International Search Report for PCT International Application No. PCT/US2012/032112, dated Jul. 3, 2012, 5 pages.

*Primary Examiner* — Jennifer A Chriss
*Assistant Examiner* — Ricardo E Lopez
(74) *Attorney, Agent, or Firm* — Jonathan L. Tolstedt

(57) ABSTRACT

The present invention relates to a high speed transmission cable (100) that includes a first inner conductor (110) and a dielectric film (120) that is concentrically arranged around at least a portion of the first conductor (110). The dielectric film (120) has a base layer (122) including a plurality of first protrusions (124) and second protrusions (126) formed on a first major surface of the base layer (122), wherein the first protrusions (124) and the second protrusions (126) are different from one another. The first protrusions (124) of the dielectric film (120) are disposed between the first inner conductor (110) and the base layer (122), the first protrusions (124) forming an insulating envelope around the first inner conductor (110).

10 Claims, 10 Drawing Sheets

(51) Int. Cl.

| | |
|---|---|
| ***H05K 9/00*** | (2006.01) |
| ***H01B 7/02*** | (2006.01) |
| ***H01B 11/18*** | (2006.01) |
| *H01B 11/20* | (2006.01) |

(58) Field of Classification Search
USPC .......................................................... 428/131
See application file for complete search history.

(56) References Cited

U.S. PATENT DOCUMENTS

| | | | | | |
|---|---|---|---|---|---|
| 2,035,274 | A | | 3/1936 | Mougey | |
| 2,038,973 | A | | 4/1936 | Wentz | |
| 2,210,400 | A | | 8/1940 | Fischer | |
| 2,381,003 | A | | 8/1945 | Ryan | |
| 2,556,244 | A | | 6/1951 | Weston | |
| 2,583,026 | A | | 1/1952 | Swift | |
| 2,599,857 | A | | 6/1952 | Mildner | |
| 2,614,172 | A | | 10/1952 | Greenfield | |
| 2,722,562 | A | | 11/1955 | McIlveen | |
| 2,792,442 | A | | 5/1957 | Parce | |
| 2,890,263 | A | | 6/1959 | Brandes | |
| 3,025,340 | A | | 3/1962 | Olson | |
| 3,077,510 | A | | 2/1963 | Olds | |
| 3,086,557 | A | | 4/1963 | Peterson | |
| 3,126,438 | A | | 3/1964 | Lorrin | |
| 3,227,800 | A | | 1/1966 | Bondon | |
| 3,244,799 | A | | 4/1966 | Roberts | |
| 3,248,473 | A | | 4/1966 | Buhmann | |
| 3,496,281 | A | * | 2/1970 | McMahon | H01B 7/0241 174/102 R |
| 3,514,523 | A | | 5/1970 | Hildebrand | |
| 3,609,207 | A | | 9/1971 | Maschio | |
| 3,650,862 | A | | 3/1972 | Burr | |
| 3,748,373 | A | | 7/1973 | Remy | |
| 3,750,058 | A | | 7/1973 | Bankert | |
| 3,789,129 | A | | 1/1974 | Ditscheid | |
| 3,864,509 | A | | 2/1975 | Gommans | |
| 4,011,118 | A | | 3/1977 | Geominy | |
| 4,018,977 | A | | 4/1977 | Herrmann | |
| 4,092,485 | A | | 5/1978 | Wanser | |
| 4,132,855 | A | | 1/1979 | Clark | |
| 4,145,565 | A | | 3/1979 | Donon | |
| 4,190,733 | A | | 2/1980 | Wootton | |
| 4,246,937 | A | | 1/1981 | Muller | |
| 4,394,705 | A | | 7/1983 | Blechman | |
| 4,487,660 | A | | 12/1984 | Netzel | |
| 4,758,685 | A | | 7/1988 | Pote | |
| 4,767,890 | A | | 8/1988 | Magnan | |
| 4,987,274 | A | | 1/1991 | Miller | |
| 5,107,076 | A | | 4/1992 | Bullock | |
| 5,130,497 | A | | 7/1992 | Yoshikawa | |
| 5,132,488 | A | | 7/1992 | Tessier | |
| 5,196,078 | A | | 3/1993 | Pote | |
| 5,262,593 | A | | 11/1993 | Madry | |
| 5,283,948 | A | * | 2/1994 | Schroeder | H05K 3/4007 29/843 |
| 5,286,923 | A | | 2/1994 | Prudhon | |
| 5,286,924 | A | | 2/1994 | Loder | |
| 5,486,649 | A | | 1/1996 | Gareis | |
| 5,532,657 | A | | 7/1996 | Stoehr | |
| 5,817,981 | A | | 10/1998 | Arroyo | |
| 5,990,419 | A | | 11/1999 | Bogese, II | |
| 6,037,545 | A | | 3/2000 | Fox | |
| 6,452,105 | B2 | | 9/2002 | Badii | |
| 6,465,737 | B1 | | 10/2002 | Bonato | |
| 6,476,326 | B1 | | 11/2002 | Fuzier | |
| 6,812,401 | B2 | | 11/2004 | Karrmann | |
| 6,812,408 | B2 | | 11/2004 | Clark | |
| 6,849,799 | B2 | | 2/2005 | Springer | |
| 7,115,815 | B2 | | 10/2006 | Kenny | |
| 7,154,043 | B2 | | 12/2006 | Clark | |
| 7,202,418 | B2 | | 4/2007 | Glew | |
| 7,205,479 | B2 | | 4/2007 | Caveney | |
| 2004/0074654 | A1 | | 4/2004 | Springer | |
| 2004/0256139 | A1 | | 12/2004 | Clark | |
| 2005/0051355 | A1 | | 3/2005 | Bricker | |
| 2007/0163800 | A1 | | 7/2007 | Clark | |
| 2007/0209823 | A1 | | 9/2007 | Vexler | |

FOREIGN PATENT DOCUMENTS

| | | | | | |
|---|---|---|---|---|---|
| GB | 921232 | | | 3/1963 | |
| GB | 1202455 | | | 8/1970 | |
| GB | 1203484 | | | 8/1970 | |
| GB | 2169437 | | | 7/1986 | |
| GB | 2169437 | A | * | 7/1986 | H01B 11/1852 |
| JP | 2010-097882 | | | 4/2010 | |
| WO | WO 2009-009747 | | | 1/2009 | |
| WO | WO 2010-148157 | | | 12/2010 | |
| WO | WO 2010-148161 | | | 12/2010 | |
| WO | WO 2010-148164 | | | 12/2010 | |
| WO | WO 2010-148165 | | | 12/2010 | |
| WO | WO 2012-138729 | | | 10/2012 | |

* cited by examiner

HIGH SPEED TRANSMISSION CABLE

TECHNICAL FIELD

The present disclosure relates generally to electrical cables for the transmission of electrical signals. In particular, the present invention relates to high speed electric cables that include a structured dielectric layer disposed adjacent to the current carrying internal conductors of the cable.

BACKGROUND

Electrical cables for the high speed transmission of electrical signals are well known. High speed transmission cables generally include an electrically conductive central conductor(s) or wire(s) surrounded by an insulating dielectric layer. An exemplary high speed transmission cable is a coaxial cable. In a coaxial cable, the electrically conductive conductor and insulating dielectric layer can further include an outer conductor and a protective outer jacket.

The insulating dielectric layer can be composed of any material or combination of materials that electrically separate the central conductor from other conductors within the cable. The material properties of the dielectric layer can significantly affect the transmission of the electrical signal along the length of a high speed transmission cable. Minimal interaction between the electric field and the dielectric layer is generally desired to maintain the signal integrity and to reduce the capacitance of the electrical signal. Capacitance slows the propagation rate of the electrical signal and reduces the signal strength. Additionally, capacitance is a strong contributor to the cable's impedance, and therefore the dielectric layer has the role of influencing the magnitude and uniformity of the cable impedance, which is generally desired to be a constant along the length of a given insulated wire. Key electrical properties influenced by the material properties of the dielectric layer include signal attenuation, signal propagation rate, capacitance per given cable length, impedance, and the uniformity of these electrical properties along the length of the cable. Conversely, it may be desirable for the cable to have prescribed electrical properties, such as a known impedance value. Prescribing these electrical properties will impact the structure and effective dielectric constant of the dielectric layer. The dielectric structure and the material's dielectric constant will directly influence the required thickness of the dielectric layer and hence the cable diameter, the cable flexibility, and related properties.

For example, the velocity of propagation (VOP) of electrical signal along a coax cable relative to the speed of the electrical signal along a conductor surrounded by air is:

$$VOP = \frac{1}{\sqrt{\varepsilon_{eff}}}$$

where $\varepsilon_{eff}$ is the effective dielectric constant of the dielectric layer surrounding the central conductor. The dielectric constant of air is virtually equal to one while solid dielectric materials have a dielectric constant of greater than one. In order to maximize the velocity of propagation of the electrical signal, the effective dielectric constant of the dielectric layer should be minimized. The inclusion of air into the dielectric layer is one way to reduce the effective dielectric constant of the dielectric layer.

Although electrical properties of the transmission cable generally improve with the incorporation of air into the dielectric structure, air alone (at ambient pressure) can not provide adequate support to counteract external forces that can be applied to the cable during manufacture, installation and use of the cable. Failure to support the external load at any point can result in local distortions of the spacing between the central conductor and surrounding structures of the cable, thereby changing the distribution of the electric and magnetic fields around the central conductor creating local impedance changes which can result in signal reflections and degraded signal integrity. If these distortions are significantly large (like a kink in the cable) or numerous, the cable may no longer be suitable as a high speed transmission line. Because air alone is not a sufficient support, the dielectric layer will also include a higher stiffness material to maintain the space between the inner conductor and the surrounding structures of the cable.

Three types of dielectric layer structures which include a significant amount of air surrounding the central conductor are routinely practiced in the art: A) foamed and expanded polymers, B) thin helically wound monofilaments and, C) axially-extruded uniform channels.

Foamed or expanded structures can have air content up to about 70% resulting in an effective dielectric constant to 1.3-1.5. However, the stiffness of the resulting dielectric layer can be quite low, and may fail to provide sufficient support to the central conductor under applied loads and may allow the central conductor to kink when tightly bent. When a load is applied, these structures readily buckle and crush.

The helically-wound structures typically utilize a monofilament or deviations thereof that are wrapped around a central conductor. An insulator tube is extruded over the wrapped conductor structure. These helically-wound structures can also have low effective dielectric constants (~1.3), but typically provide support against external forces at one point around the circumference of the central conductor at any given cross-section. This individual contact point can also be insufficient to support external load exerted at any point around the circumference of the central conductor that is not directly adjacent to the wrapped filament which can lead to local deformations or kinking of the central conductor on bending and result in attendant signal integrity issues.

The third type of dielectric layer structure which includes a significant amount of air are longitudinally extruded structures formed along the conductor axis with a modified extrusion tip. These extruded structures are generally in the form of uniform channels and can generally result in an effective dielectric constant of 1.45 or higher. However, the axial extrusion process of a molten polymer is not well-suited to providing small, closely-spaced features since surface tension and the dynamics of extruding a liquid material in this manner drives rounding of the features. Additionally, this process cannot readily form features that vary along the axial direction, (i.e. each cross section profile is the same). Also, the process is limited to materials that can be extruded around a conductor at the required thickness.

In summary, the prior art dielectric structures do not have sufficient ability to provide low effective dielectric constants combined with sufficient mechanical integrity and design flexibility. A need exists for high speed transmission cables that include a dielectric layer that incorporates a significant amount of air adjacent to and around the central conductor while providing more uniform support around the central conductor resulting in a dielectric layer having greater mechanical stability while simultaneously having a low effective dielectric constant.

SUMMARY

In one aspect, the present invention provides a high speed transmission cable that includes an air rich dielectric layer. The high speed transmission cable includes a first inner conductor and a dielectric film that is concentrically arranged around at least a portion of the first conductor. The dielectric film has a base layer including a plurality of first protrusions and second protrusions formed on a first major surface of the base layer, wherein the first protrusions and the second protrusions are different from one another. The first protrusions of the dielectric film are disposed between the first inner conductor and the base layer, the first protrusions forming an insulating envelope around the first inner conductor.

The above summary of the present invention is not intended to describe each disclosed embodiment or every implementation of the present invention. The Figures and detailed description that follow below more particularly exemplify illustrative embodiments.

DETAILED DESCRIPTION

In the following detailed description of the preferred embodiments, reference is made to the accompanying drawings that form a part hereof. The accompanying drawings show, by way of illustration, specific embodiments in which the invention may be practiced. It is to be understood that other embodiments may be utilized and structural or logical changes may be made without departing from the scope of the present invention. The following detailed description, therefore, is not to be taken in a limiting sense, and the scope of the invention is defined by the appended claims.

The present invention is directed to a high speed transmission cable having a structured dielectric film(s) formed around at least one internal conductors to create electrical transmission line with higher propagation speed, lower weight, and smaller size (and higher density) as well as greater dielectric constant consistency and greater crush resistance than conventional cable designs. The structured dielectric film(s) create air spaces around the inner conductor. In one exemplary aspect, a high speed transmission cable having a structured dielectric film(s) can be formed around two or more internal conductors.

In another exemplary aspect, the structured dielectric film can include base layer having first and second protrusions formed on at least a portion of one major surface, where the first and second protrusions are different from one another. The protrusions are disposed between the inner conductor(s) and the base layer to form an air-rich dielectric layer surrounding the inner conductors. Incorporating air into a primary dielectric material in a transmission line can provide a number of benefits including reduction in weight, reduction in the loss contributed by the dielectric material, and a reduction in the dielectric constant of the resulting dielectric film. The dielectric constant reduction in turn increases the signal propagation rate and reduces the dielectric thickness needed for a given impedance and therefore the transmission cable can be smaller.

A common method for incorporating air is to foam the insulating material, but the resulting material can crush easily and the air content is frequently dispersed heterogeneously through the insulating material resulting in a dielectric material having a non constant dielectric constant. The insulating material used in the present invention is a structured dielectric film where the air is incorporated in a repeating or structured way into the transmission cable. In this way, a structured dielectric film can be created having a lower dielectric constant than the dielectric constant of the material used to form the protrusions and/or the base layer of the structured dielectric film.

Figure 1:
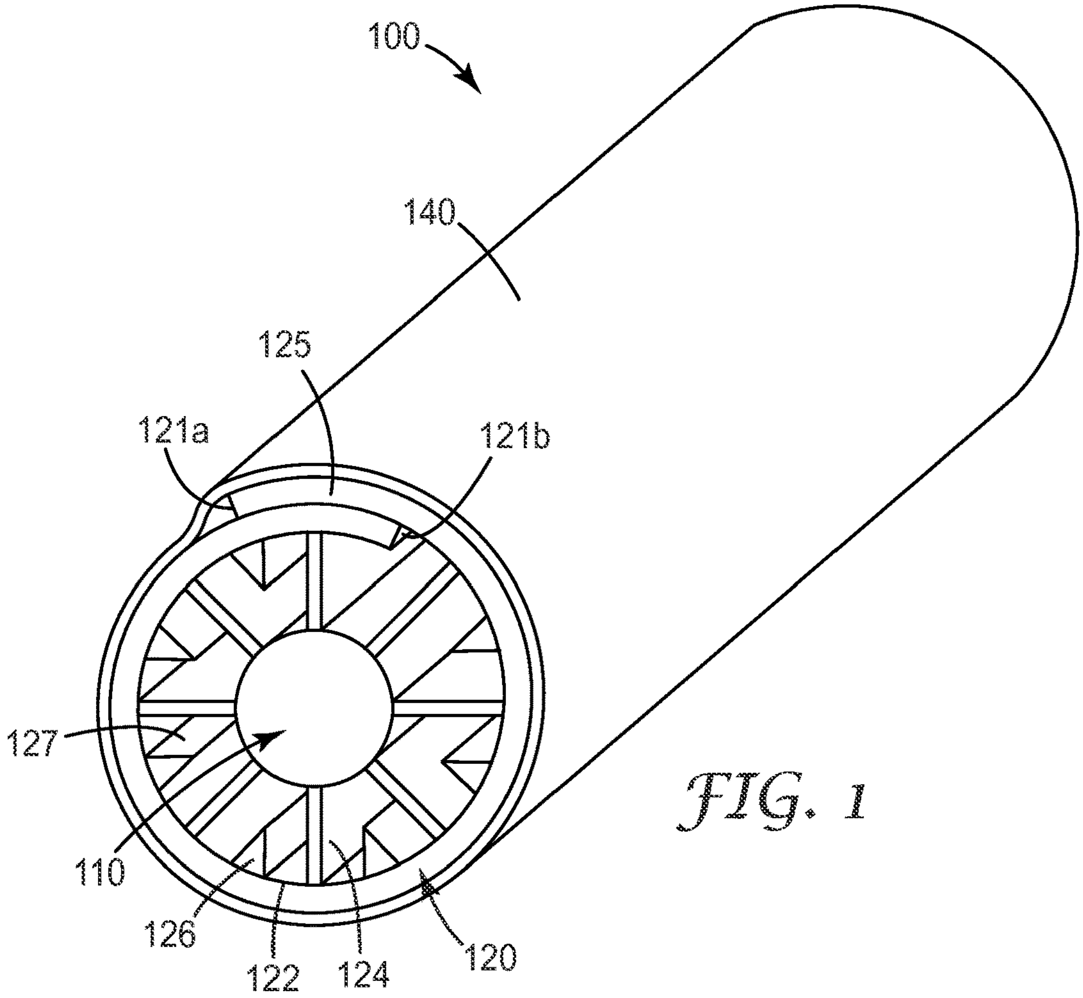
FIG. 1 shows an isometric view of exemplary high speed transmission cable according to an aspect the present invention.

FIG. 1 illustrates an exemplary embodiment of a high speed transmission cable 100 according to an aspect of the present invention. The high speed transmission cable can include a first inner conductor 110 and a dielectric film 120 that is concentrically arranged around at least a portion of the first inner conductor. The dielectric film has a base layer 122 including a plurality of first protrusions 124 and a plurality of second protrusions 126 formed on a first major surface of the base layer, wherein the first protrusions and the second protrusions are different from one another. The first protrusions of the dielectric film are disposed between the first inner conductor and the base layer, the first protrusions forming an insulating envelope around the first inner conductor.

The first inner conductor can be in the form of a bare conductor, a metallic ribbon or wire, a coated conductor comprising an inner conductive core and on insulating layer surrounding the inner conductive core or a coaxial cable.

The first and second protrusions can be characterized by the geometry of the protrusion as well as by a critical dimension. Thus, first protrusions 124 have a first geometry characterized by a first critical dimension and the second protrusions 126 have a second geometry characterized by a second critical dimension. The first and second protrusions of the current invention differ from one another such that at least one of the protrusions' geometries or critical dimensions are different. For example, the first protrusion might be in the form of a rectangular wall as shown in FIG. 1 and the second protrusion 126 can be of a different shape such as a continuous triangular ridge as shown. Alternatively, the geometries of the first and second protrusions may be the same but have a different critical dimension, for example the height of the protrusion or the distance that the protrusions extend from the first major surface of the base layer can be different. In one exemplary aspect, the first protrusions can determine the distance between base layer of the dielectric film and the surface of the first inner conductor while the second protrusions may act as strengthening or rigidizing members to help support the film in its desired configuration. The addition of strengthening protrusions can allow the separation between the first protrusions to be increased thus increasing the amount air immediately surrounding the inner conductor.

Dielectric film 120 can have a flat flange portion 125 disposed adjacent to a first longitudinal edge 121*a* of the dielectric film and a textured portion 127 wherein the first and second protrusions 122, 124 are disposed on the textured portion of the dielectric film. When the dielectric film is wrapped around the first inner conductor, the flange portion can overlap the textured portion of the previous wrap. In one exemplary aspect, an adhesive (not shown) can be placed on the flange portion of the dielectric film to bond each wrap to adjacent wraps of the dielectric film. The flange portion can be an integral part of the dielectric film's base layer 122 or the flange portion can be a separate strip of material which is adhered to the dielectric film's base layer along one of the longitudinal edges of the base layer.

The exemplary high speed transmission cable 100 can have a protective jacket 140 formed over the second major surface of dielectric film 120.

Figure 4:
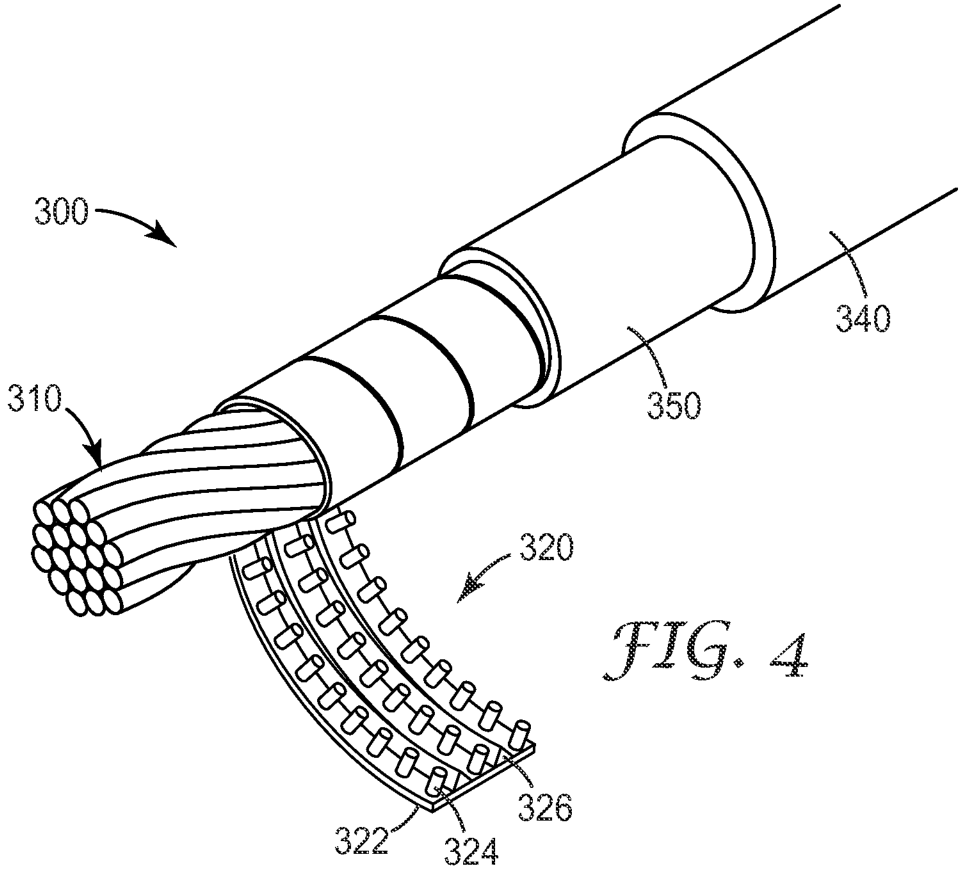
FIG. 4 shows an isometric view of another exemplary high speed transmission cable according to an aspect the present invention.

In a first exemplary aspect, dielectric film 120 can be longitudinally wrapped around the first inner conductor 110 such that a first longitudinal edge 121*a* and a second longitudinal edge 121*b* of the dielectric film are aligned with the first inner conductor as shown in FIG. 1. In an alternative aspect, dielectric film 320 can be spirally wrapped around the first inner conductor 310 as shown in FIG. 4.

FIGS. 2A-2C and FIG. 3 illustrate a variety dielectric films that can be used in a high speed transmission cable according to an aspect the present invention.

Figure 2A:
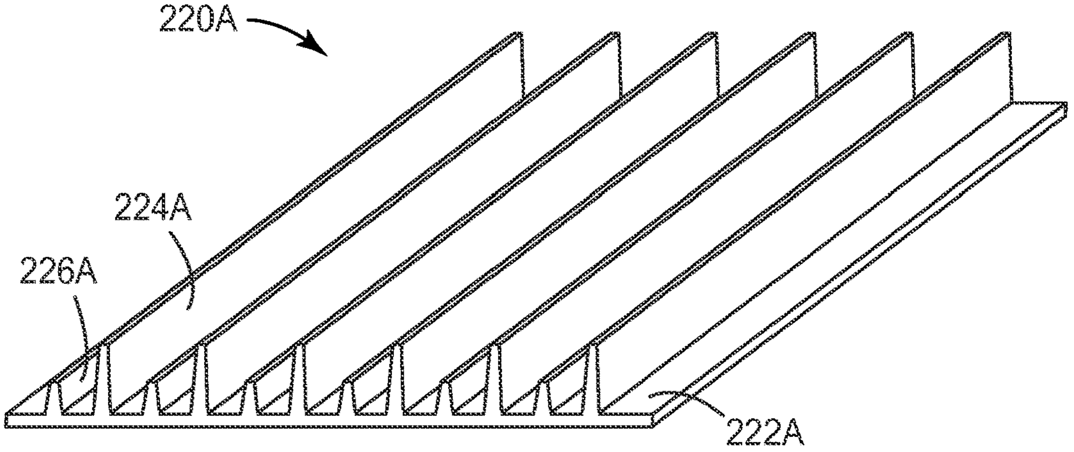
FIGS. 2A-2C show three isometric views of exemplary dielectric films that can be used in a high speed transmission cable according to an aspect the present invention.

FIG. 2A shows an isometric view of dielectric film 220A which includes a base layer 222A having a plurality of first protrusions 224A and a plurality of second protrusions 226A formed on a first major surface of the base layer. The first protrusions have a first geometry characterized by a first critical dimension and the second protrusions have a second geometry characterized by a second critical dimension. First protrusions 224A and second protrusions 226A are both in the form of continuous longitudinally extending prisms or triangular ridges. The critical dimension of the first protrusions is the height of the ridge which will control the separation between the first inner conductor and the base layer of dielectric film 220A. The second protrusions are smaller than the first protrusions and can serve to reinforce the base layer to prevent buckling or kinking of the dielectric film when the first protrusions are spaced further apart.

Figure 2B:
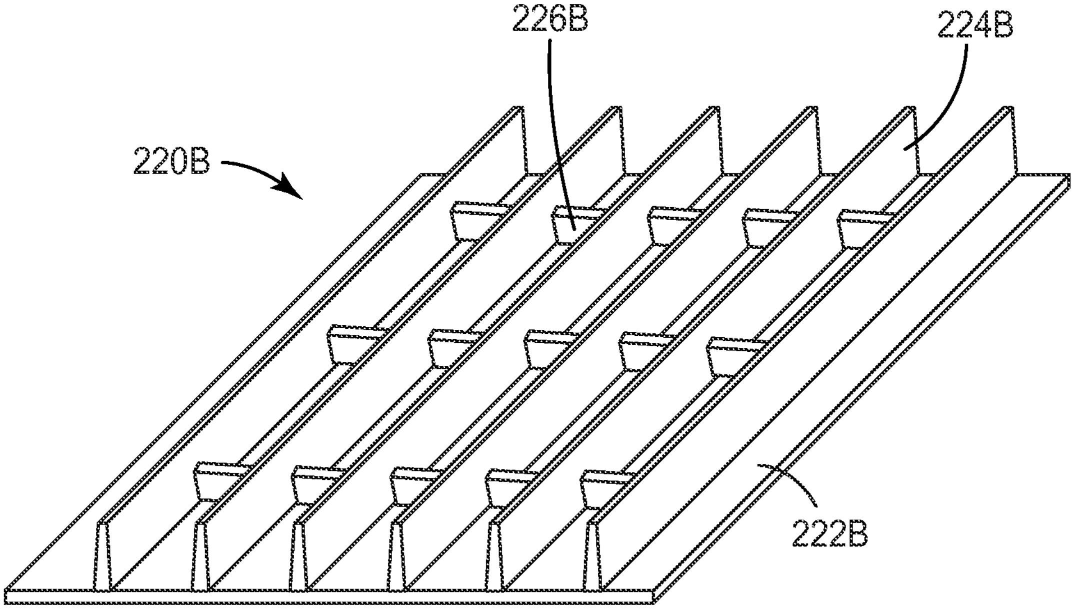

FIG. 2B shows an isometric view of dielectric film 220B which includes a base layer 222B having a plurality of first protrusions 224B and a plurality of second protrusions 226B formed on a first major surface of the base layer. The first protrusions have a first geometry characterized by a first critical dimension and the second protrusions have a second geometry characterized by a second critical dimension. First protrusions 224B are in the form of continuous longitudinally extending ridges while the second protrusions 226B are in the form of transverse discontinuous ridges that are disposed between the first protrusions. The critical dimension of the first protrusions is again the height of the longitudinal ridges which controls the separation between the inner conductor(s) and the base layer of the dielectric film. The second protrusions can be the same size or smaller than the first protrusions.

Figure 2C:
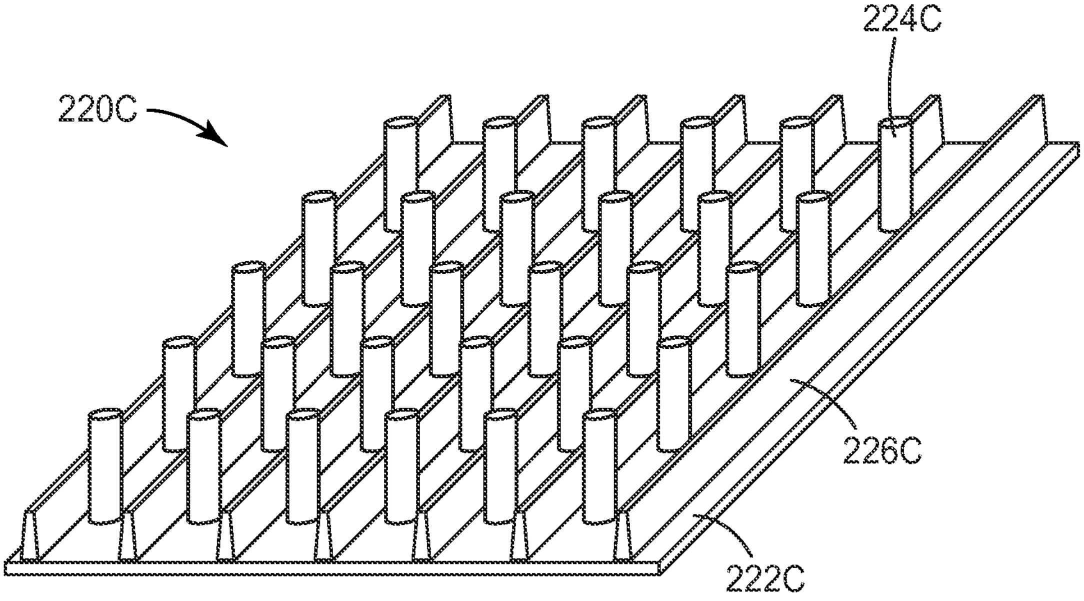

FIG. 2C shows an isometric view of dielectric film 220C which includes a base layer 222C having a plurality of first protrusions 224C and a plurality of second protrusions 226C formed on a first major surface of the base layer. First protrusions 224C are in the form of discrete cylindrical posts while the second protrusions 226C are in the form of continuous longitudinally extending ridges that are disposed between the first protrusions. The critical dimension of the first protrusions is again the height of the ridge which controls the separation between the inner conductor(s) and the base layer of the dielectric film. The second protrusions can be the same size or smaller than the first protrusions.

Figure 3:
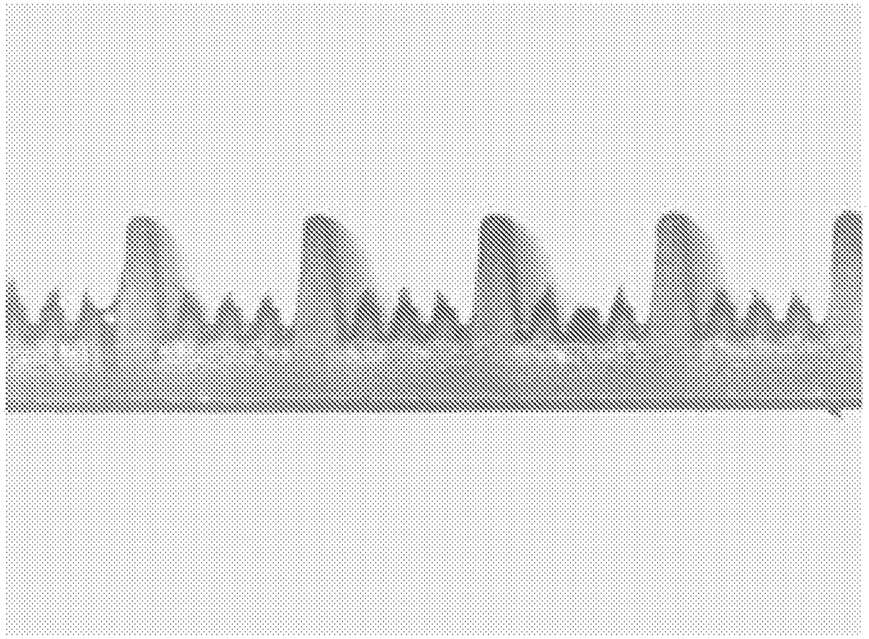
FIG. 3 is a photograph of a cross section of an exemplary dielectric film that can be used in a high speed transmission cable according to an aspect the present invention.

FIG. 3 is a micrograph showing a cross section of an exemplary dielectric film in accordance with the current invention. This dielectric film has a plurality of first protrusions in the form of continuous longitudinal ridges separated from one another by grouping of three second protrusions also in the form of continuous longitudinal ridge. One advantage of this construction is that it will be easier to wrap around the inner conductor than a dielectric film having only the first protrusions since the smaller protrusions will not be as stiff in the longitudinal direction as the larger first protrusions while still supporting the base layer between the first protrusions to prevent it from kinking or buckling. Additionally, the second protrusions can be used to reinforce the first protrusions; when the aspect ratio of the first protrusions get large then the second protrusions can be used to reinforce the base of the first protrusion. Additionally, when the second protrusions are shorter than the first protrusions they will provide enhanced crush resistance of the transmission cable when a local force is applied to the outside surface of the cable. As the dielectric film is compressed against the inner conductor, the amount of force to compress the dielectric structure will increase when the second protrusions contact the inner conductor.

The base layer of the dielectric film can be one of an insulating film, a metal foil, a bilayer structure composed of an insulating film and a metal layer, or another multilayer material. One exemplary multilayer material can have a buried conductive layer between two insulating layers. Another exemplary multilayer material can have a plurality of conductive layers separated by insulating layers. In one exemplary aspect, the base layer of the dielectric film is a continuous sheet of material while in another aspect the base layer can be a perforated sheet of material.

The dielectric film can be formed by a variety of processes known in the art including extrusion, embossing, casting, lamination, and molding processes. The base layer and protrusions may be formed simultaneously by an extrusion process from a melt processable dielectric material, such as a thermoplastic resin, utilizing an appropriate die profile. When produced by an extrusion process, the protrusions and the base layer may be formed of a single material or the base layer may be formed of a first material and the protrusions may be formed of a second material when a co-extrusion process is used.

Alternatively, the protrusions of the dielectric film can be created by embossing the protrusions into the base layer. The base layer can be a film substrate of a dielectric material that softens at elevated temperatures or a partially cured dielectric material that can be cross linked after the film substrate is contacted with an embossing platen or mold on which the protrusions are formed. When an embossing process is used, the protrusions and the base layer will be formed of a single material.

In another alternative aspect, a melt processable dielectric material or a curable dielectric material can be dispensed on to a textured mold or roller. After cooling or curing, the material can be removed from the mold or roller yielding the dielectric film. In this way, the base layer and the protrusions can be formed simultaneously. In an alternative aspect, a premade film substrate may be used as the base layer. A melt processable dielectric material or a curable dielectric material can be dispensed between the base layer and a textured mold or roller. After cooling or curing, the material can be removed from the mold or roller yielding the dielectric film. In this way, the protrusions can be formed either of the same material as the base layer or can be a different material. For example, the protrusions can be formed by casting a curable monomer or prepolymer between the mold and an existing base layer film, followed by a UV or thermal cure.

Exemplary premade film substrates for the base layer can include polyimide films, polyester films, polyolefin films, fluoropolymer films, poly carbonate films, polyethylene naphthalate films, ethylene propylene diene monomer rubber films, liquid crystal polymer films, polyvinyl chloride films, etc. In one exemplary aspect, premade film substrates for the base layer can be a metallized polymer film, such as a metallized polyimide or polyester film. Alternatively, base layer can be a metal foil, (e.g. a copper foil) or other planar conductive material that can be used as a substrate for forming the dielectric film. In yet another aspect, the base layer can be a material composed of two or more individual layers that have been laminated together to form a striated base layer.

When a base layer is a metal foil or includes a metallic or conductive sub-layer, the sub-layer can be used as a ground plane when it is used to form a high speed transmission cable. Integration of the ground plane into the dielectric film eliminates the need for a separate additional ground plane as well as potentially eliminating some or all of the dielectric material between the central conductor and the ground plane, such as the case when the base layer is composed solely of a metallic foil or when the first major surface of the base layer on which the protrusions are formed is metallic. In either of these two aspects, the dielectric properties of the film arise from the protrusions and air that are disposed between the metallic surface of the base layer and the inner conductor(s).

Exemplary melt processable dielectric materials include polyolefin resins, fluoropolymer resins, polycarbonate resins, nylon resins, thermoplastic elastomer resins, ethylene vinyl acetate copolymer resins, polyester resins, and liquid crystal polymer resins.

Exemplary curable dielectric materials include thermoset resins including epoxies, silicones, and acrylates, or cross-linkable prepolymer.

FIG. 4 illustrates an exemplary embodiment of a high speed transmission cable 300 according to an aspect of the present invention. Transmission cable 300 can include a stranded first inner conductor 310 comprising a plurality of smaller gauge bare metal wires and a dielectric film 320 that is spirally wrapped around the first inner conductor. The dielectric film has a base layer 322 including a plurality of first protrusions 324 and a plurality of second protrusions 326 formed on a first major surface of the base layer, wherein the first protrusions and the second protrusions are different from one another. First protrusions 324 are in the form of discrete cylindrical posts while the second protrusions 226 are in the form of continuous longitudinally extending ridges that are disposed between the first protrusions. The critical dimension of the first protrusions is the height of the post which controls the separation between the inner first conductor and the base layer of the dielectric film an insulating envelope around the first inner conductor.

High speed transmission cable 300 can further include a shielding layer 350 disposed over the spirally wrapped dielectric film. The shielding layer can help ground the transmission cable, help control the impedance of the cable as well as prevent electromagnetic interference emissions from the cable. The shielding layer can be in the form of a metal foil or a braid or woven metal layer which is disposed over the dielectric layer wrapped around the first inner conductor.

Additionally, high speed transmission cable 300 can have a protective jacket 340 formed over shielding layer 350.

Figure 5A:
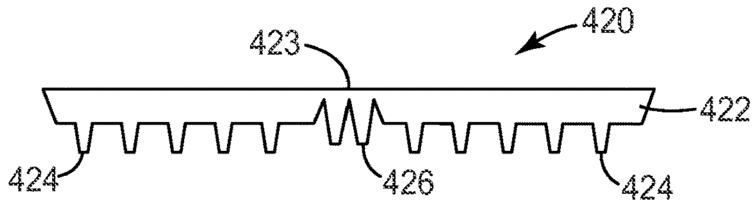
FIG. 5A is schematic cross section of an exemplary dielectric film that can be used in a high speed transmission cable according to an aspect the present invention.

FIG. 5A shows a cross-section of an exemplary dielectric film 420 having a base layer 422 having a thinned portion 423 along the mid line of the dielectric film that extends longitudinally along the length of the film into the page. The dielectric film has a plurality of first protrusions 424 formed on the first major surface of the dielectric film on either side of the thinned portion and two second protrusions 426 formed on the first major surface of the thinned portion 423 of the base layer to form an engineered bend region in the dielectric film.

Figure 5B:
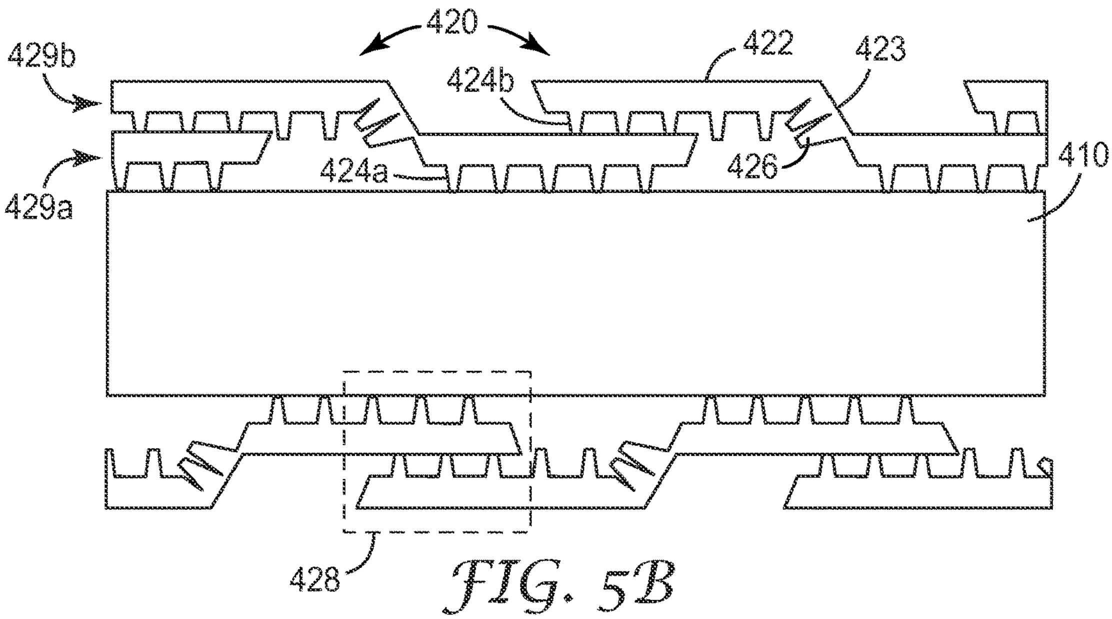
FIGS. 5B-5C are schematic cross-sectional views of two exemplary transmission cables incorporating the dielectric film of FIG. 5A.
Figure 5C:
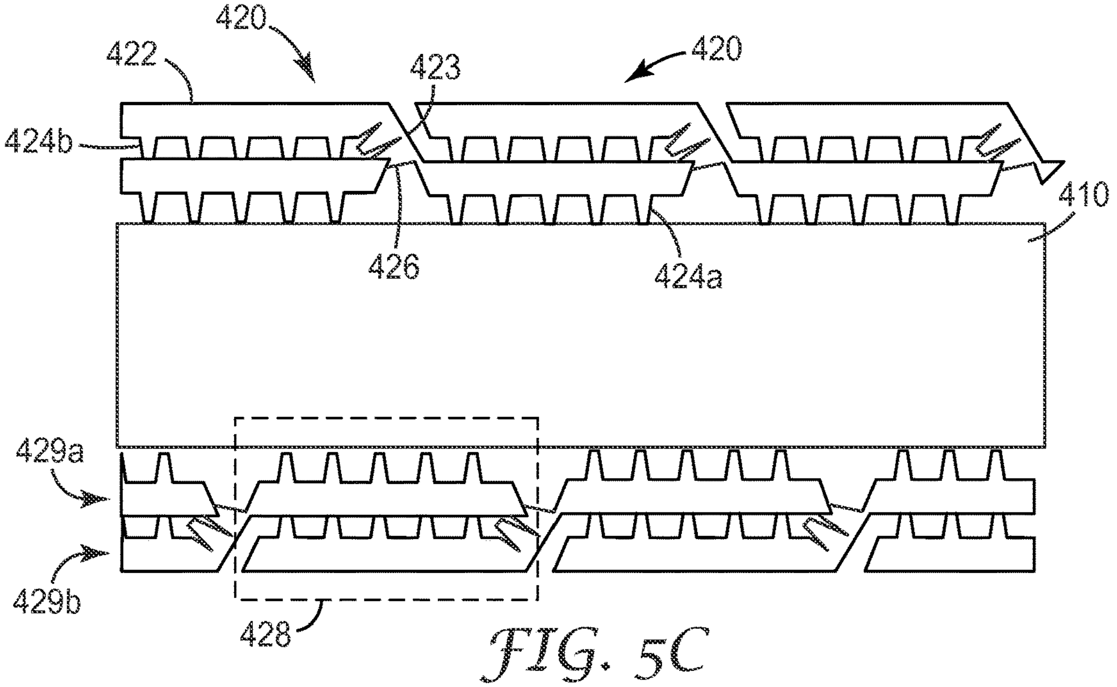

FIGS. 5B and 5C show how dielectric film can be spirally wrapped around a first inner conductor 410. For a spirally wrapped inner conductor, it may be desired to have the outer wrap conform around the previous wrap's edge as shown in FIG. 5B by forming steps in the dielectric film itself (not shown), or providing a dielectric film that is sufficiently flexible. This flexibility can be inherent property of the dielectric film based on the materials used or can be engineered into the structure of the dielectric film by selecting a thickness or protrusion shape and size that imparts more conformability. Inclusion of thinned portion 423 imparts added flexibility to the film along the mid-line of the dielectric film. The second protrusions 426 formed in the thinned portion can help control the bend of the dielectric film. In particular, second protrusions 426 can contact one another to prevent the dielectric film from bending too sharply or kinking in the engineered bending region of the dielectric film.

FIG. 5B shows the dielectric film spirally wrapped around inner conductor 410 having about a twenty-five percent overlap region 428. The first protrusions 424*a* provide an offset between the base layer 422 and the inner conductor 410 on the first wrap level 429*a* and first protrusions 424*b* provide an offset between the base layer on the first wrap level and the base layer on the second wrap level 429*b*. The second protrusions help to control the bending in the thinned portion of the dielectric film. In an exemplary aspect, adhesive an be placed in the overlap region to secure the wrapped dielectric material in place.

FIG. 5C shows the dielectric film spirally wrapped around inner conductor 410 having about a fifty percent overlap region 428. The first protrusions 424*a* provide an offset between the base layer 422 and the inner conductor 410 on the first wrap level 429*a* and first protrusions 424*b* provide an offset between the base layer on the first wrap level and the base layer on the second wrap level 429*b*. The second protrusions help to control the bending in the thinned portion of the dielectric film and to control the spacing of the wrap.

Figure 6A:
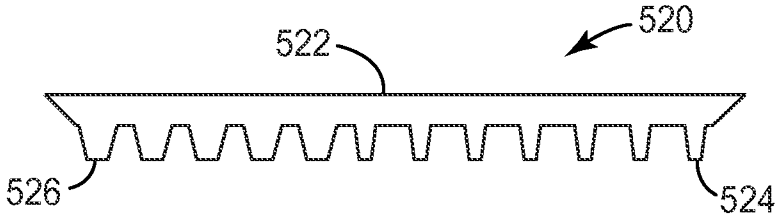
FIG. 6A is schematic cross section of another exemplary dielectric film that can be used in a high speed transmission cable according to an aspect the present invention.

FIG. 6A shows a cross-section of an exemplary dielectric film 520 having a base layer 522 having a plurality of first protrusions 524 formed on a portion of the first major surface of the dielectric film and a plurality of second protrusions 526 formed on a second portion of the first major surface of the base layer. The first protrusions have a narrower profile than the second protrusions which allows more air to be present adjacent to the inner conductor when the dielectric film is spirally wrapped around the inner conductor as shown in FIG. 6B.

Figure 6B:
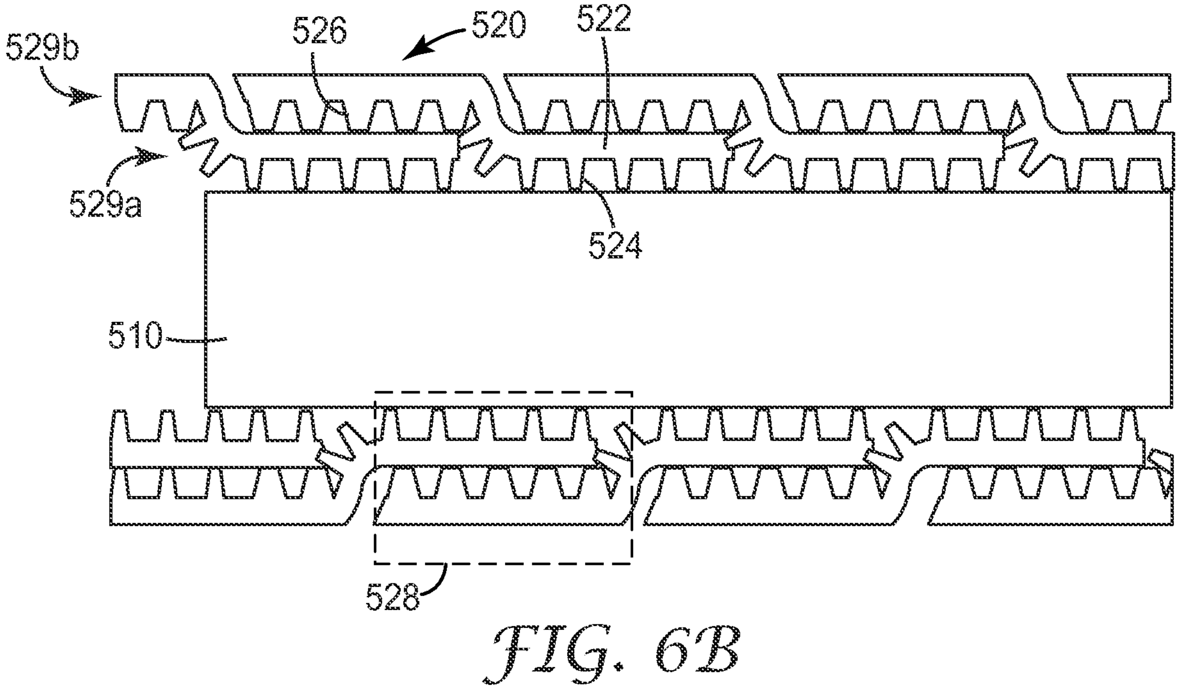
FIG. 6B is a schematic cross-sectional view of an exemplary transmission cable incorporating the dielectric film of FIG. 6A.

In FIG. 6B, the dielectric film 520 can be spirally wrapped around inner conductor 510 having about a fifty percent overlap region 528. The first protrusions 524 provide an offset between the base layer 522 and the inner conductor 510 on the first wrap level 529*a* and second protrusions 526 provide an offset between the second major surface of the base layer on the first wrap level and the base layer of the second wrap level 529*b*.

Figure 7A:
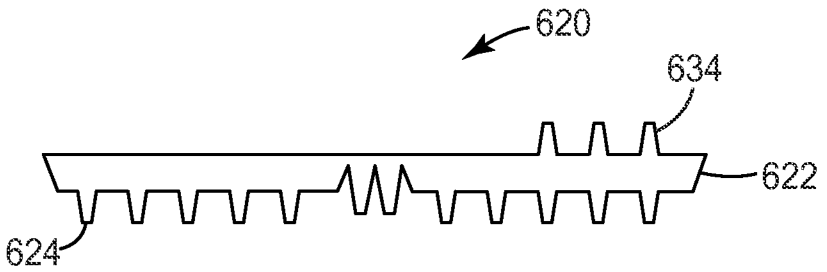
FIG. 7A is a schematic cross section of another exemplary dielectric film that can be used in a high speed transmission cable according to an aspect the present invention.
Figure 7B:
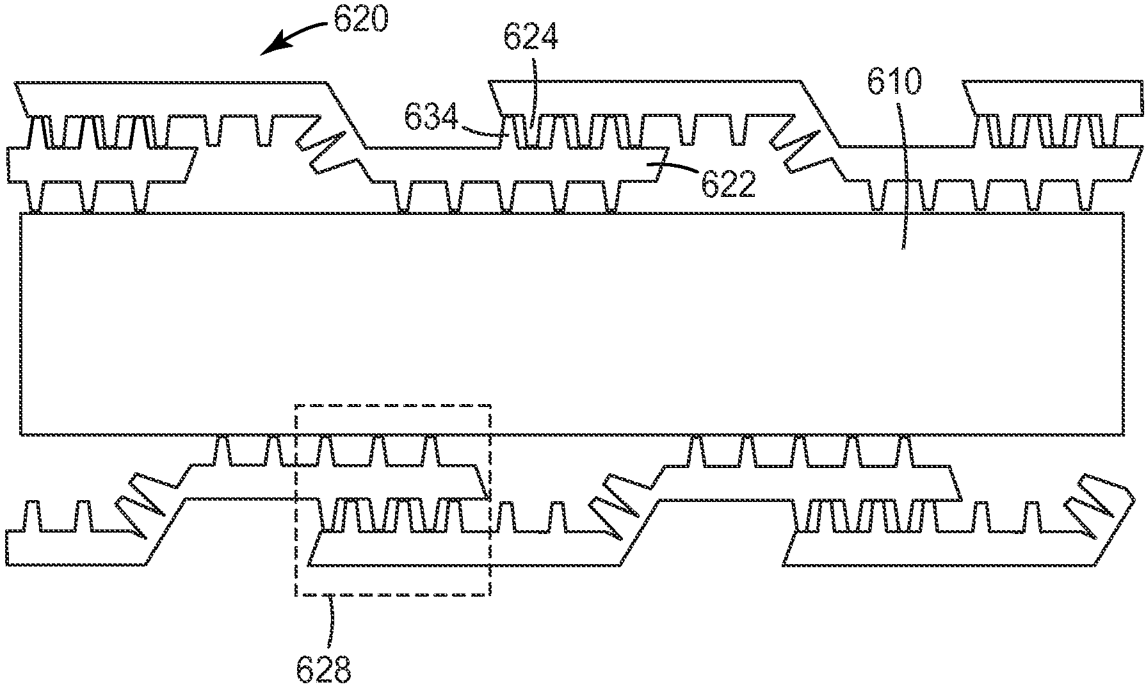
FIG. 7B is a schematic cross-sectional view of an exemplary transmission cable incorporating the dielectric film of FIG. 7A.

FIG. 7A shows a cross-section of an exemplary dielectric film 620 that is similar to dielectric film 420 shown in FIG. 5A except that dielectric film 620 includes a plurality of third protrusions 634 formed on the second major surface of base layer 622. The third protrusions 634 can mate with first protrusions 624 in the overlap region 628 of the spirally wrapped dielectric film as shown in FIG. 7B.

Figure 8A:
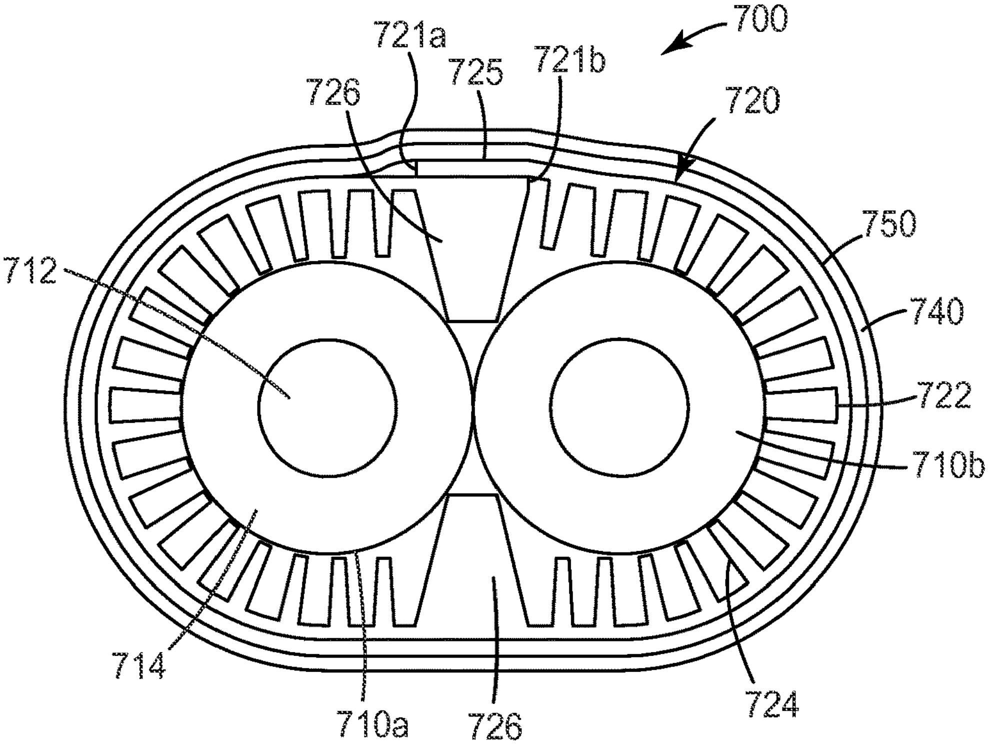
FIGS. 8A-8B are schematic cross-sectional views of two exemplary transmission cables according to an aspect the present invention.
Figure 8B:
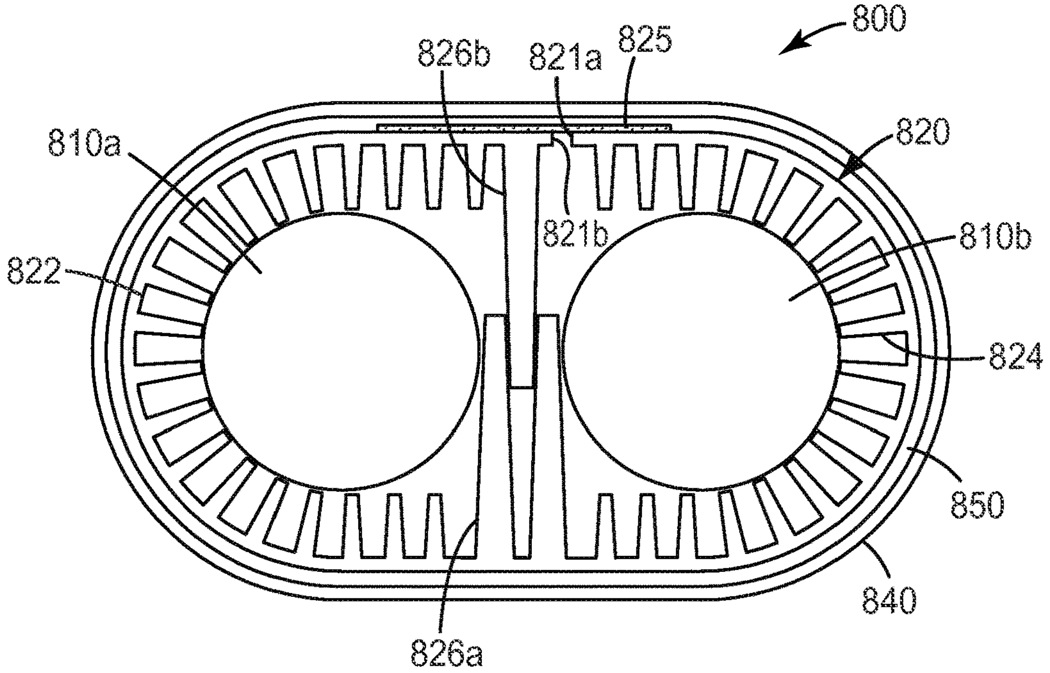

FIGS. 8A and 8B illustrate two variations of a another embodiment of an exemplary high speed transmission cable 700, 800 in accordance with the current invention. Transmission cables 700, 800 can be classified as twin axial cables (also known as twinax cables) wherein two inner conductors 710*a,b* and 810*a,b,* respectively, are placed side-by-side within the cable. The structured dielectric film 720, 820 that surrounds the inner conductors supports and interacts strongly with the electric field when a current travels along the cable. As such, electrical properties of the dielectric film, such as the dielectric constant and loss, are critical to the signal speed and signal integrity of the transmission cable. These twin axial cable constructions can yield increased velocity of signal propagation, low loss, and low capacitance, which enables smaller diameter transmission cables for the same impedance as conventional cable designs. Because parallel twinax conductors is a fundamental structure for data transmission lines, there is a need to manufacture this structure in a cost-effective, efficient manner while preserving the excellent transmission line characteristics and mechanical properties of the transmission cable.

FIG. 8A illustrates an exemplary high speed transmission cable 700. Transmission cable 700 includes two parallel inner conductors 710*a*, 710*b* defining a longitudinal axis of the transmission cable and a structured dielectric film 720 at least partially concentrically disposed around the inner conductors. The inner conductors can be coated conductors comprising an inner conductive core 712 and an insulating layer 714 surrounding the inner conductive core or jacketed coaxial cables to ensure that they are electrically isolated from one another.

Dielectric film 720 includes a base layer 722 having an integral flange portion 725 formed along the first longitudinal edge 721*a* of the base layer and a textured portion. The textured portion includes a plurality of first protrusions 724 formed on a first major surface of the base layer and two larger second protrusions 726 also formed on the first major surface of the base layer adjacent to the second longitudinal edge 721*b* of the base layer and along the midline of the base layer. The first protrusions 724 provide an offset between the base layer 722 and the inner conductors 710*a*, 710*b*. The second protrusions 726 can behave as spacers and/or positioning elements between the inner conductors 710*a*, 710*b* when the dielectric film is wrapped around the pair of inner conductors.

When the dielectric film is wrapped around the pair of inner conductor, the flange portion 725 can overlap the textured portion of the dielectric film. In one exemplary aspect, an adhesive (not shown) can be placed on the flange portion of the dielectric film to secure the dielectric film around the inner conductors.

High speed transmission cable 700 can further include a shielding layer 750 which can help ground the transmission cable, help control the impedance of the cable as well as prevent electromagnetic interference emissions from the cable. The shielding layer can be in the form of a metal foil, braid or woven metal layer which is disposed over the dielectric film wrapped inner conductors.

Additionally, high speed transmission cable 700 can have a protective jacket 740 formed over shielding layer 750.

FIG. 8B illustrates an exemplary high speed transmission cable 800. Transmission cable 800 includes two parallel inner conductors 810*a*, 810*b* defining a longitudinal axis of the transmission cable and a structured dielectric film 820 at least partially concentrically disposed around the inner conductors. The inner conductors can be bare conductors, coated conductors comprising an inner conductive core and an insulating layer surrounding the inner conductive core or coaxial cables.

Dielectric film 820 includes a base layer 822 can have a flange portion 825 disposed along the first longitudinal edge 821*a* of the base layer and a textured portion, wherein the flange portion can be a separate member which is attached to the second major surface of the dielectric film along one of the longitudinal edges of the dielectric film. In an exemplary aspect, the flange portion can be a piece of tape that extends along one of the longitudinal edges of the dielectric film prior to wrapping the dielectric film around the inner conductors. After the dielectric film has been wrapped around the inner conductors the free side of the tape flange portion can be adhered to the second major surface of the dielectric film along the second longitudinal edge 821*b*. The textured portion includes a plurality of first protrusions 824 formed on a first major surface of the base layer and two larger interlocking protrusions 826*a*, 826*b* also formed on the first major surface of the base layer. One of the interlocking protrusions 826*b* can be formed adjacent to the second longitudinal edge 821*b* of the base layer and the other of the interlocking protrusions 826*a* can be formed along the midline of the base layer. The first protrusions 824 provide an offset between the base layer 822 and the inner conductors 810*a*, 810*b*. The interlocking protrusions 826*a*, 826*b* interlock to secure at least a portion of the dielectric film around at least one of the inner conductors. Additionally, protrusions 826*a*, 826*b* can behave as a spacer between the inner conductors 810*a*, 810*b* when the dielectric film is wrapped around the pair of inner conductors to prevent the inner conductors from coming in direct contact.

When the dielectric film is wrapped around the pair of inner conductor, the flange portion 825 can overlap the textured portion of the dielectric film. In one exemplary aspect where the flange portion is formed from a tape, the flange portion can secure the dielectric film around the inner conductors.

High speed transmission cable 800 can further include a shielding layer 850 which can help ground the transmission cable, help control the impedance of the cable as well as prevent electromagnetic interference emissions from the cable. The shielding layer can be in the form of a metal foil, braid or woven metal layer which is disposed over the dielectric layer wrapped around the first inner conductor.

Additionally, high speed transmission cable 800 can have a protective jacket 840 formed over shielding layer 850.

FIGS. 9A-9D illustrate four additional variations of a twinax-style high speed transmission cables 900A-900D in accordance with the current invention.

Figure 9A:
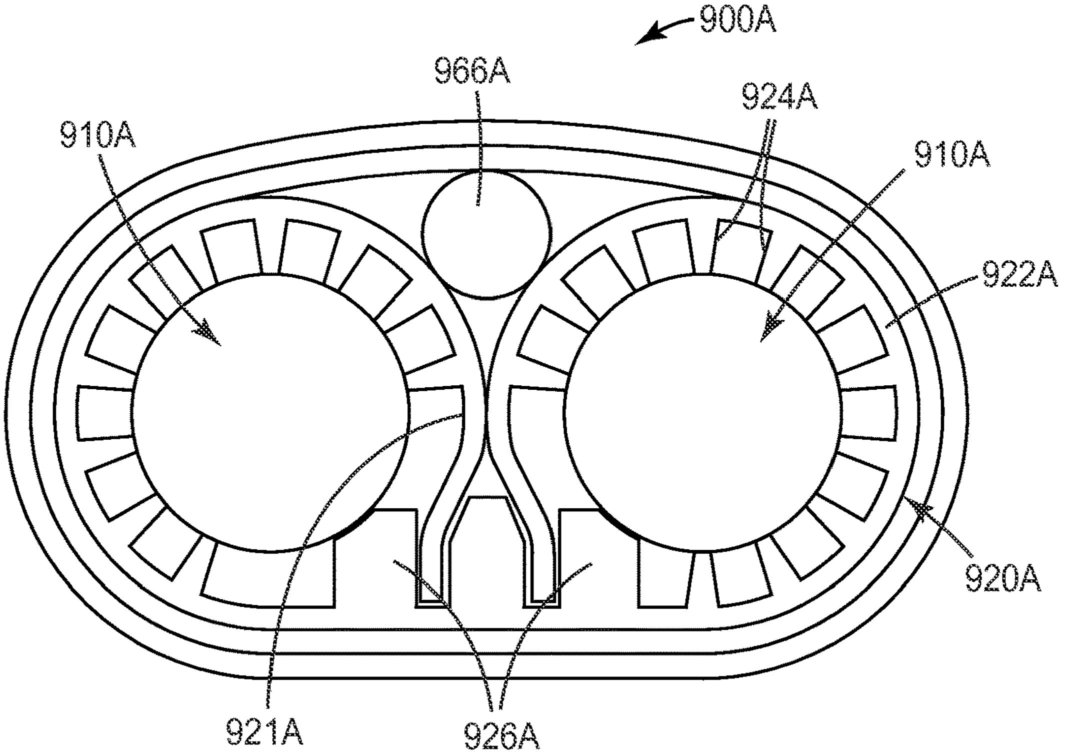
FIGS. 9A-9D show schematic cross sectional views of a portion of four exemplary alternative high speed transmission cables according to an aspect the present invention.

Referring to FIG. 9A, high speed transmission cable 900A includes two parallel inner conductors 910A defining a longitudinal axis of the transmission cable and a structured dielectric film 920A. The dielectric film is at least partially concentrically disposed around the inner conductors such that a section 921A of the dielectric film is disposed between the two parallel inner conductors. The dielectric film includes a base layer 922A having a plurality of first protrusions 924A formed on a first major surface of the base layer. Additionally, dielectric film 920A can have one or more secondary protrusions 926A formed on the first major surface of the base layer. The secondary protrusions can be used to secure section 921A of the dielectric film between the two inner conductors.

Figure 9B:
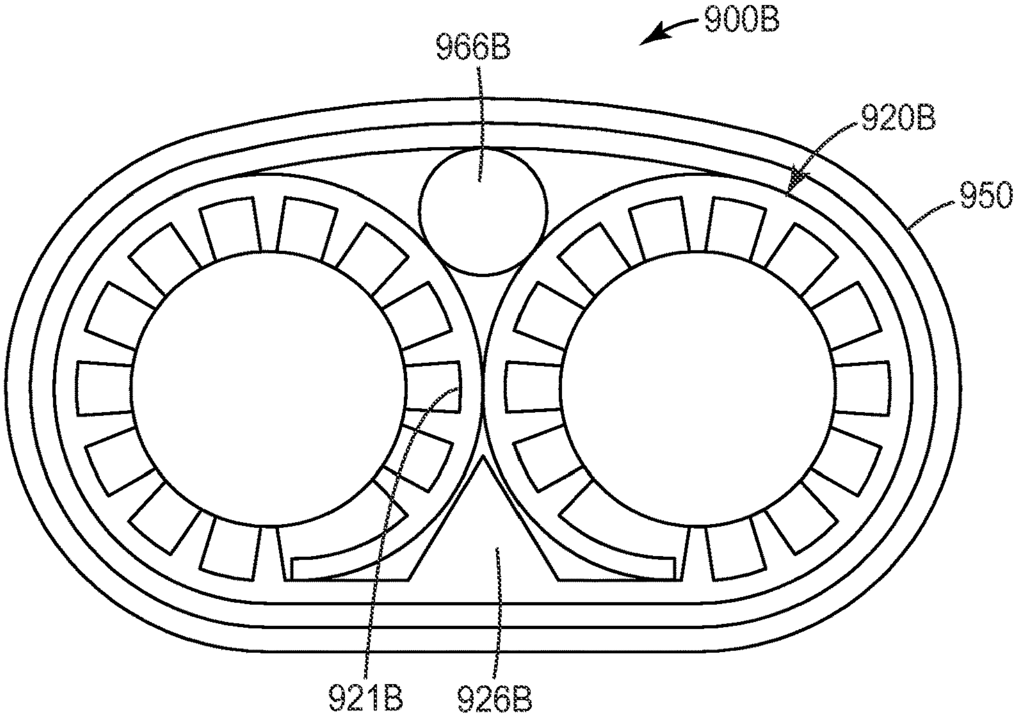
Figure 9C:
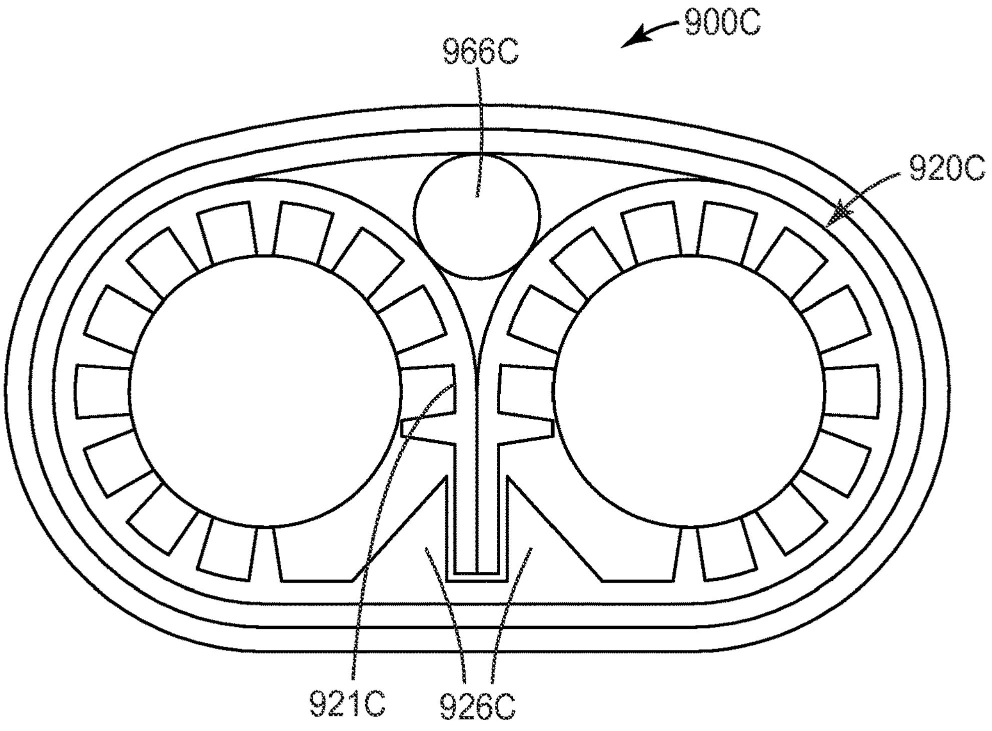

Similarly, high speed transmission cables 900B, 900C shown in FIGS. 9B and 9C include different forms of the second protrusions 926B, 926C to secure section 921B, 921C of dielectric film 920B, 920C between the pair of inner conductors. In particular, FIG. 9B shows a dielectric film wherein the second protrusion 926B in the form of a continuous triangular ridge. Protrusion 926B can additionally facilitate wrapping of the dielectric film around the inner conductors by directing the edges of the dielectric film under the inner conductors where the edges will be trapped after shielding layer 950 and protective jacket (not shown) are formed over the dielectric wrapped inner conductors. FIG. 9C shows how the free ends of the dielectric film 920C may be captured between two facing second protrusions 926C when the dielectric film is wrapped around the pair of inner conductors.

Figure 9D:
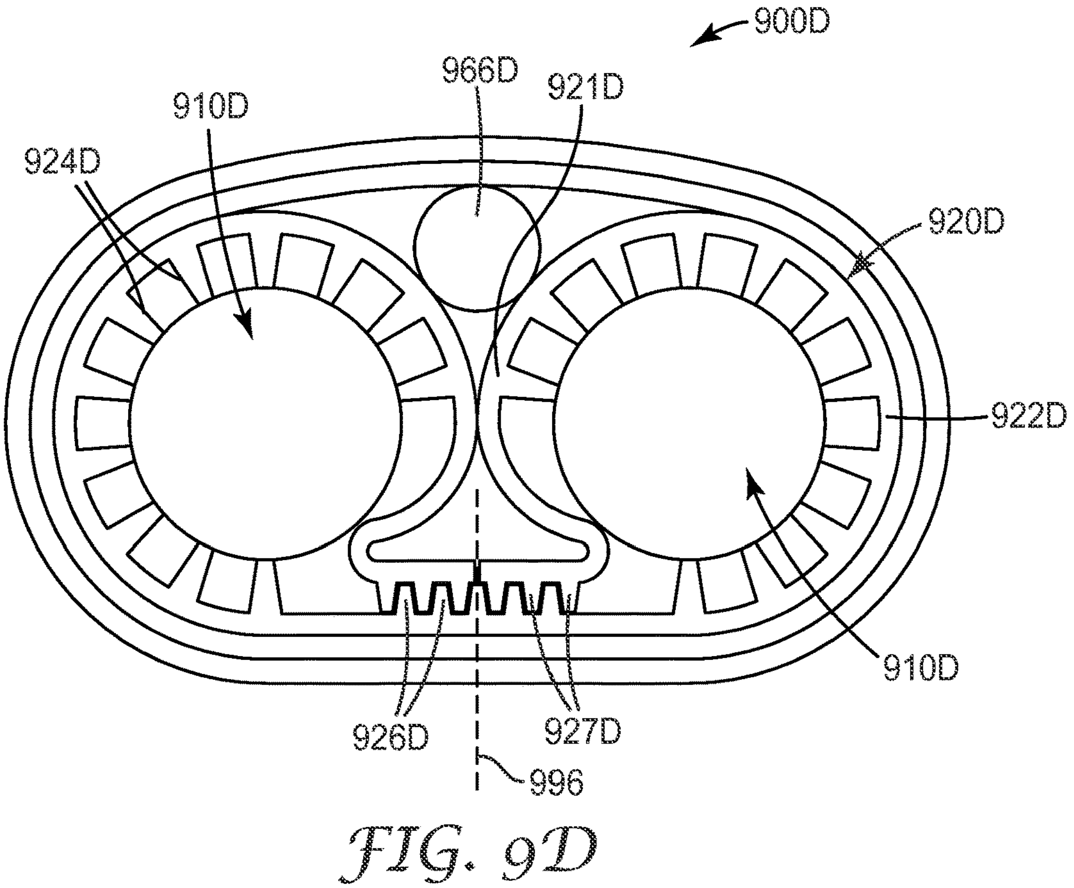

Referring to FIG. 9D, high speed transmission cable 900D includes two parallel inner conductors 910D defining a longitudinal axis of the transmission cable, a structured dielectric film 920D at least partially concentrically disposed around the inner conductors wherein a section 921D of the dielectric film is disposed between the two parallel inner conductors. The dielectric film 920D includes a base layer 922D having a plurality of first protrusions 924D formed on a first major surface of the base layer. Dielectric film 920D can have a set of second protrusions 926D formed along the midline 996 of the dielectric film on the first major surface of the base layer and a plurality of third protrusions 927D disposed adjacent to the longitudinal edges of the dielectric film. The second and third protrusions 926D, 927D have a shape designed to intermate with one another to secure sections 921D between the pair of inner conductors.

Optionally, the transmission cables can include at least one additional longitudinal member 966A-966D extending parallel the inner conductor(s) as shown in FIGS. 9A-9D. In an exemplary aspect, the additional longitudinal member can be in the form of a drain wire extending parallel to the plurality of spaced apart inner conductors. Alternatively, the additional longitudinal member can be an optical conductor, a spacer, a strength member, or an additional conductor.

Figure 10A:
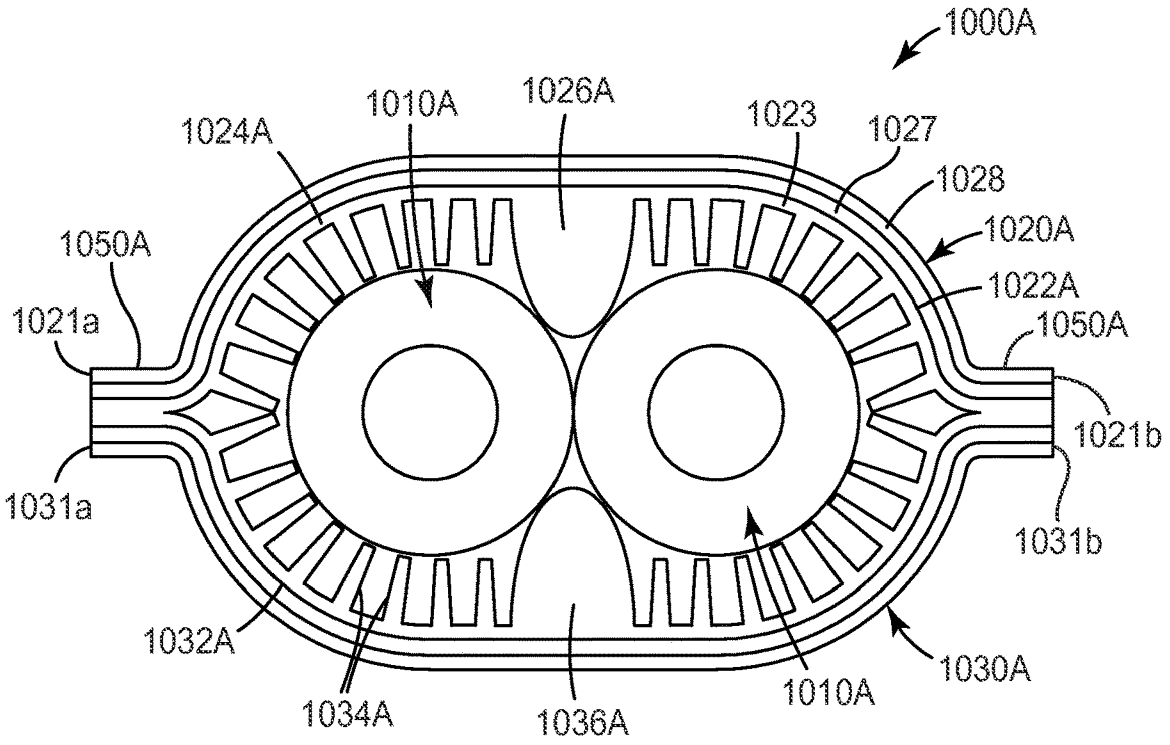
FIGS. 10A-10B show schematic cross sectional views of a portion of two exemplary alternative high speed transmission cables according to an aspect the present invention.

FIG. 10A illustrates an exemplary embodiment of a high speed transmission cable 1000A according to an aspect of the present invention. The high speed transmission cable includes two parallel inner conductors 1010A defining a longitudinal axis of the transmission cable, a first dielectric film 1020A at least partially concentrically disposed around the inner conductors, a second dielectric film 1030A at least partially concentrically disposed around the inner conductors opposite the first dielectric film and a pinched portion 1050A joining the first and second dielectric films. The inner conductors can be a bare conductor in the form of a metallic ribbon or wire, a coated conductor comprising an inner conductive core and an insulating layer surrounding the inner conductive core or a coaxial cable.

The first dielectric film 1020A includes a first edge 1021*a* and a second edge 1021*b* longitudinally aligned with the inner conductors 1010A. The first dielectric film includes a base layer 1022A having a plurality of first protrusions 1024A formed on a first major surface of the base layer, wherein the first dielectric film can be disposed such that the base layer is partially concentric with the inner conductors and wherein a portion of the first protrusions is disposed between the inner conductors and the base layer in a region where the base layer is concentric with the inner conductors.

The second dielectric film 1030A can be similar the first dielectric film 1020A in that the second dielectric film includes a first edge 1031*a* and a second edge 1031*b* longitudinally aligned with the inner conductors 1010A. The second dielectric film includes a base layer 1032A having a plurality of first protrusions 1034A formed on a first major surface of the base layer. The second dielectric film can be disposed partially concentric with the inner conductors opposite the first dielectric film such that the base layer of the second dielectric film is partially concentric with the inner conductors and wherein a portion of the first protrusions of the second dielectric film are disposed between the inner conductors and the base layer of the second dielectric in a region where the base layer is concentric with the inner conductors.

The first and second dielectric films 1020A, 1030A can further include at least one larger second protrusion 1026A, 1036A, respectively, formed along the midline of the first major surface of each base layer. The second protrusions 1026A, 1036A, can behave as spacers between the inner conductors 1010A when the first and second dielectric films 1020A, 1030A are arranged at least partially concentric with respect to the inner conductors. Alternatively, the second protrusions can serve as alignment elements to facilitate the assembly of the high speed transmission cable.

The base layer 1022A of the first dielectric film 1020A can include a plurality of sub-layers. In particular, base layer 1022A includes 3 sub-layers, an insulating sub-layer 1023 having the first and second protrusions formed on a first major surface thereof, a metallic sub-layer 1027 disposed adjacent to the second major surface of the insulating sub-layer and a protective insulating or jacket sub-layer 1028 disposed over the metallic sub-layer. The metallic sub-layer can act as a shielding layer to help ground the high speed transmission cable; can help control the impedance of the cable as well as preventing electromagnetic interference emissions from the cable. The second dielectric film 1032A can have a similar construction to the first dielectric film. Alternatively, the first and second dielectric films can comprise any number of layers made up of a combination of insulating and conductive materials.

The pinched portions extend parallel with the longitudinal axis of the inner conductors and form an insulating envelope around inner conductors by joining the first and second dielectric films 1020A, 1030A. The first and second dielectric films of transmission cable 1000A can be joined together by the interlocking protrusions of the first dielectric film with protrusions of second dielectric film in the pinched portion, by an adhesive disposed between the first and second dielectric films or by fusion bonding the first and second dielectric films at a sufficient temperature and pressure to cause the protrusions to melt and flow together to form the bonding region in the pinched portion.

Figure 10B:
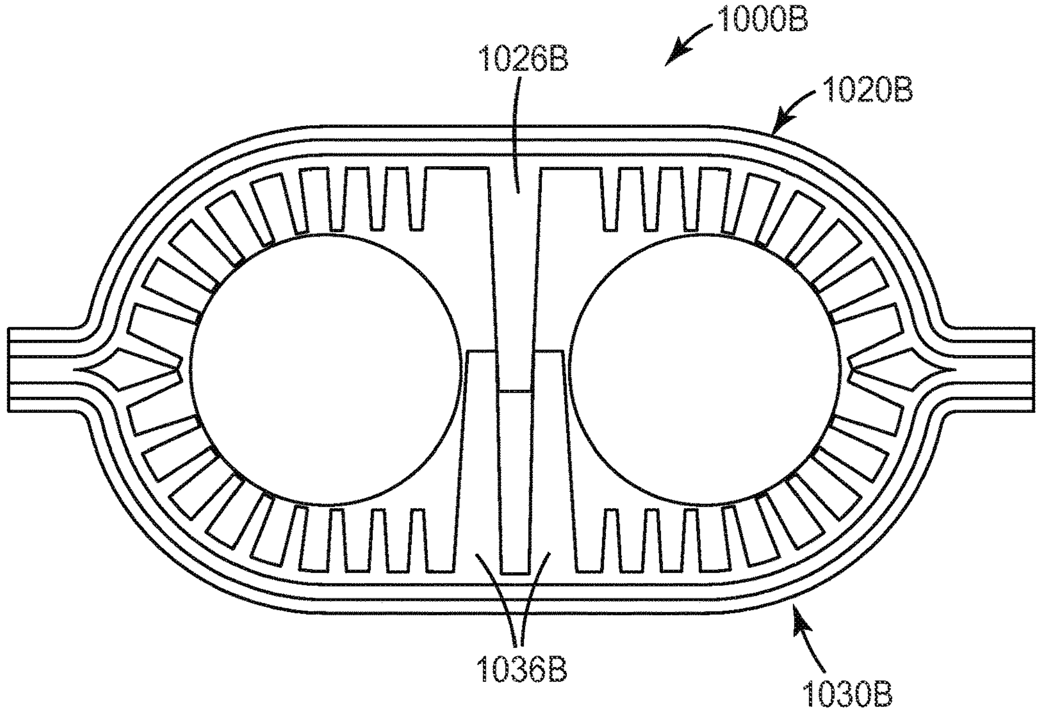

FIG. 10B shows an alternative transmission cable 1000B wherein the second protrusion(s) 1026B of the first dielectric film 1020B interlock with the second protrusions 1036B of the second dielectric film 1030B. As shown, these protrusions can be used to bond the first and second dielectric films and to separate the inner conductors.

In an exemplary aspect, the transmission cable structures described above may be combined with one or more similar cable structures to form a higher order structured cable for use in a cable assembly. The higher order cables or assemblies can have electrical and mechanical performance benefits over cables having a single sub-unit.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown herein and described without departing from the scope of the present invention. Those with skill in the mechanical, electro-mechanical, and electrical arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

Following are exemplary embodiments of a high speed transmission cable according to aspects of the present invention.

Embodiment 1 is a high speed transmission cable comprising a first inner conductor and a dielectric film comprising a base layer including a plurality of first protrusions and second protrusions formed on a first major surface of the base layer, wherein the first protrusions and the second protrusions are different, and wherein at least a portion of the dielectric film is concentric with the inner conductor such that the first protrusions are disposed between the first inner conductor and the base layer, the first protrusions forming an insulating envelope around the first inner conductor.

Embodiment 2 is the transmission cable of embodiment 1, wherein the dielectric film is longitudinally wrapped around the first inner conductor.

Embodiment 3 is the transmission cable of embodiment 1, wherein the dielectric film is spirally wrapped around the first inner conductor.

Embodiment 4 is the transmission cable of embodiment 1, wherein the first base layer of the first dielectric material is selected from one of an insulating film, a metal foil, a bilayer structure composed of a insulating film and a metal layer, and other multilayer structure combinations of insulating layers and conductive layers.

Embodiment 5 is the transmission cable of any of the previous embodiments, further comprising protective insulating layer disposed over a second major surface of the dielectric film.

Embodiment 6 is the transmission cable of embodiment 5, further comprising an outer conductor disposed between at least one of the protective insulating layer and the first dielectric film and the protective insulating layer and the second dielectric film.

Embodiment 7 is the transmission cable of embodiment 1, further comprising at least one additional longitudinal member extending parallel to the first inner conductor.

Embodiment 8 is the transmission cable of embodiment 7, wherein the at least one additional longitudinal member is one of a ground conductor, an optical conductor, a strength member and an additional conductor.

Embodiment 9 is the transmission cable of embodiment 1, wherein the base layer of the dielectric material includes a thinned portion.

Embodiment 10 is the transmission cable of embodiment 1, wherein the first protrusions have a first geometry characterized by a first critical dimension and the second protrusions have a second geometry characterized by a second critical dimension.

Embodiment 11 is the transmission cable of embodiment 10, wherein the first critical dimension of the first protrusion is greater than the second critical dimension of the second protrusion Embodiment 12 is the transmission cable of embodiment 10, wherein the first geometry of the first protrusions is one of a post, a continuous ridge, a discontinuous ridge, a bump, and a pyramid.

Embodiment 13 is the transmission cable of embodiment 10, wherein the second geometry of the second protrusions is one of a post, a continuous ridge, a discontinuous ridge, a bump, and a pyramid.

Embodiment 14 is the transmission cable of embodiment 1, further comprising a plurality of third protrusions formed on a portion of the second major surface of the base layer wherein at least a portion of one of the first and second protrusions interlock with the third protrusions when the dielectric film is wrapped around the first conductor.

Embodiment 15 is the transmission cable of embodiment 1, wherein the dielectric film has a flat flange portion and a textured portion wherein the first and second protrusions are disposed on the textured portion.

Embodiment 16 is the transmission cable of embodiment 15, wherein the flat flange portion is integrally formed with the dielectric film.

Embodiment 17 is the transmission cable of embodiment 15, wherein the flat flange portion is laminated along at least one longitudinal edge of the dielectric film.

Embodiment 18 is the transmission cable of embodiment 15, wherein the flat flange portion is positioned over a portion of the dielectric film when the dielectric film is wrapped around the first inner conductor.

Embodiment 19 is the transmission cable of embodiment 1, further comprising a second inner conductor disposed adjacent to the first inner conductor and contained within the insulating envelope.

Embodiment 20 is the cable of embodiment 19, wherein the dielectric film is longitudinally wrapped around the first and second inner conductors, wherein a portion of the dielectric is disposed between the first inner conductor and the second inner conductor.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the mechanical, electro-mechanical, and electrical arts will readily appreciate that the present invention may be implemented in a very vide variety of embodiments. This application is intended to cover any adoptions or variations of the preferred embodiments discussed herein. Therefore, it is manifestly intended that this invention be limited only by the claims and the equivalents thereof.

What is claimed is:

1. A high speed transmission cable comprising a first inner conductor and a longitudinal dielectric film extending along a length of the dielectric film and the cable and comprising a base layer including a plurality of first protrusions and second protrusions formed on a first major surface of the base layer and a plurality of third protrusions formed on a portion of an opposing second major surface of the base layer, wherein the first protrusions and the second protrusions are different and wherein in a transverse cross-section of the dielectric film perpendicular to the longitudinal direction of the dielectric film, the first and second protrusions are arranged in a row and spaced apart from each other, and wherein at least a portion of the dielectric film is concentric with the inner conductor such that the first protrusions are disposed between the first inner conductor and the base layer, the first protrusions forming an insulating envelope around the first inner conductor, and wherein at least a portion of one of the first and second protrusions interlock with the third protrusions when the dielectric film is wrapped around the first conductor.

2. The transmission cable of claim 1, wherein the dielectric film is longitudinally wrapped around the first inner conductor.

3. The transmission cable of claim 1, wherein the dielectric film is spirally wrapped around the first inner conductor.

4. A high speed transmission cable comprising a first inner conductor and a longitudinal dielectric film extending along a length of the dielectric film and the cable and comprising a base layer including a plurality of first protrusions and second protrusions formed on a first major surface of the base layer, wherein the first protrusions and the second protrusions are different and wherein in a transverse cross-section of the dielectric film perpendicular to the longitudinal direction of the dielectric film, the first and second protrusions are arranged in a row and spaced apart from each other, and wherein at least a portion of the dielectric film is concentric with the inner conductor such that the first protrusions are disposed between the first inner conductor and the base layer, the first protrusions forming an insulating envelope around the first inner conductor, wherein the base layer of the dielectric material includes a thinned portion, and wherein first protrusions are formed on either side of the thinned portion and the second protrusions are formed on the thinned portion so that bases of the second protrusions are lower than bases of the first protrusions.

5. The transmission cable of claim 1, wherein the first protrusions have a first geometry characterized by a first critical dimension and the second protrusions have a second geometry characterized by a second critical dimension.

6. The transmission cable of claim 5, wherein the first critical dimension of the first protrusion is greater than the second critical dimension of the second protrusion.

7. The transmission cable of claim 5, wherein the first geometry of the first protrusions is one of a post, a continuous ridge, a discontinuous ridge, a bump, and a pyramid.

8. The transmission cable of claim 5, wherein the second geometry of the second protrusions is one of a post, a continuous ridge, a discontinuous ridge, a bump, and a pyramid.

9. The transmission cable of claim 1, further comprising a second inner conductor disposed adjacent to the first inner conductor and contained within the insulating envelope.

10. The cable of claim 9, wherein the dielectric film is longitudinally wrapped around the first and second inner conductors, wherein a portion of the dielectric is disposed between the first inner conductor and the second inner conductor.

* * * * *